United States Patent [19]
Ihara

[11] Patent Number: 5,414,661
[45] Date of Patent: May 9, 1995

[54] SEMICONDUCTOR MEMORY DEVICE

[75] Inventor: Makoto Ihara, Sakurai, Japan

[73] Assignee: Sharp Kabushiki Kaisha, Osaka, Japan

[21] Appl. No.: 117,252

[22] Filed: Sep. 3, 1993

[30] Foreign Application Priority Data

Sep. 8, 1992 [JP] Japan .................................. 4-239814

[51] Int. Cl.⁶ .............................................. G11C 7/00
[52] U.S. Cl. ..................................... 365/203; 365/149
[58] Field of Search ................... 365/203, 149, 230.06, 365/233

[56] References Cited

PUBLICATIONS

Okamura, J., et al., "Decoded-source sense amplifier for high-density DRAMs" *IEEE Cat. No. 89 TH 0262-6, JSAP CAT. No. AP891216*, 1989 Symposium on VLSI Circuits Digest of Technical Papers, (1989) pp. 103-104.

Primary Examiner—Joseph A. Popek
Attorney, Agent, or Firm—Morrison & Foerster

[57] ABSTRACT

A semiconductor memory device is disclosed. The semiconductor memory device includes: memory cells for storing data; bit-line pairs connected to the memory cells; a bit-line precharge signal generating circuit for generating bit-line precharge signals in order to precharge the bit-line pairs to a prescribed potential; switching-element pairs for electrically connecting the bit-line pairs to data-line pairs; and column decoders each applying a column select signal to the corresponding switching-element pair in accordance with column addresses to be input. In the semiconductor memory device, a condition of $V_P \leq V_A \leq V_p + V_T$ is substantially satisfied, where $V_P$ represents the prescribed potential to which the bit-line pairs are precharged in accordance with the bit-line precharge signals generated by the bit-line precharge signal generating circuit, $V_T$ represents a threshold voltage of each of the switching-element pairs, and $V_A$ represents a potential of the column select signal in an active state.

6 Claims, 11 Drawing Sheets

SEMICONDUCTOR MEMORY DEVICE

BACKGROUND OF THE INVENTION

1. Field of the Invention

The present invention relates to a semiconductor memory device such as a dynamic random access memory (RAM).

2. Description of the Related Art

FIG. 8 partially shows a circuit of a conventional semiconductor memory device (one of memory blocks). In FIG. 8, a memory cell array 1, a row decoder 2, a column pre-decoder 90, a column decoder 4, a bit-line pair 31, a data-line pair 32, a switching-element pair 34, and the like are shown. Herein, one bit line of the bit-line pair 31 is indicated by 31A, and the other bit line is indicated by 31B. Similarly, one data line of the data-line pair 32 is indicated by 32A, and the other data line is indicated by 32B. Also, one switching element of the switching-element pair 34 is indicated by 34A, and the other switching element is indicated by 34B. A switching element can also be an N-channel transistor, not being limited to this specific type.

Into the memory block shown in FIG. 8, row addresses and column addresses (CA0–CA7) are input.

The row decoder 2 selectively sets a word line 30 among a plurality of word lines 30 active in accordance with the input row addresses. Herein, the phrase "to set a signal line active" means "to set a signal line into a logically activated state or a selected state, by setting the potential of the signal line to a certain value". Similarly, the phrase "to set a signal line inactive" used herein means "to set a signal line into a logically inactivated state or a non-selected state, by setting the potential of the signal line to another certain value".

The column pre-decoder 90 selectively sets one signal line to be active in each of four signal-line sets (CA01, CA23, CA45, and CA67), in accordance with the input column addresses (CA0–CA7). Each of the signal-line sets consists of four signal lines. Depending on the combination of the signal lines which are selectively set active by the column pre-decoder 90, any one of the 0th to 255th column decoders is selected. A column signal line 47 which is connected to the selected column decoder is set to be active. At this time, a switching-element pair 34 which is connected to the activated column signal line 47 is turned ON, so that the bit-line pair 31 and the data-line pair 32 are electrically connected to each other.

A bit-line precharge signal generating circuit 7 generates a bit-line precharge signal. In response to the bit-line precharge signal, the potential of each of the bit lines 31A and 31B is precharged to ½ Vcc, where Vcc represents the power supply potential. The potential of each of the data lines 32A and 32B are precharged to the same potential as that of the bit lines 31A and 31B.

When the bit-line pair 31 is being precharged, a sense amplifier driving signal generating circuit 8 sets both the potentials of a PMOS sense amplifier driving signal line 48 and an NMOS sense amplifier driving signal line 49 to ½ Vcc. When a sense amplifier 9 operates, the sense amplifier driving signal generating circuit 8 sets the potential of the PMOS sense amplifier driving signal line 48 to Vcc and the potential of the NMOS sense amplifier driving signal line 49 to GND.

The sense amplifier 9 amplifies the potential difference read from memory cells 33 onto the bit-line pair 31.

A main amplifier 5 amplifies the potential difference of the data-line pair 32. An output circuit 6 outputs a signal for identifying the data stored in the memory cells 33 at an output terminal 35 in accordance with the output of the main amplifier 5.

A timing generating circuit 10 sets signal lines 51–55 to be active at predetermined timings. The signal lines 51–55 are connected to the row decoder 2, the bit-line precharge signal generating circuit 7, the sense amplifier driving signal generating circuit 8, the column pre-decoder 90 and the main amplifier 5, respectively.

FIG. 9 shows an exemplary configuration of the conventional column pre-decoder 90. As is shown in FIG. 9, the column pre-decoder 90 includes four circuits 60, 61, 62, and 63. The circuit 60 selectively sets one of the four signal lines active in the signal-line set CA67, in accordance with the input column addresses CA6 and CA7. The circuit 61 and the circuit 62 are identical with the circuit 60 and operate in the same way as the circuit 60 operates. The circuit 63 selectively sets one of four signal lines active in the signal-line set CA01, in accordance with the input column addresses CA0 and CA1. In this conventional example, the potential of a signal line which is selectively set to be active is the power supply potential (Vcc).

FIG. 10 shows potential variations of various signal lines during the operation of the conventional semiconductor memory device shown in FIG. 8. In FIG. 10, the horizontal axis represents time, and the vertical axis represents voltage. In this conventional example, the data read out from the memory cells 33 is assumed to be at a low level (L).

The timing generating circuit 10 sets the signal line 52 inactive, and the signal lines 51, 53, 54 and 55 active. As a result, as is shown in FIG. 10, the potential of each signal line varies.

When the signal line 52 is set to be inactive, the bit-line precharge signal Generating circuit 7 makes the potential of the bit-line precharge signal to the low level (L).

When the signal line 51 is set to be active, the row decoder 2 selectively makes one word line 30 active, in accordance with the input row addresses.

When the signal line 53 is set to be active, the sense amplifier driving signal generating circuit 8 changes the potential of the PMOS sense amplifier driving signal line 48 from ½ Vcc to Vcc (power supply potential), and also changes the potential of the NMOS sense amplifier driving signal line 49 from ½ Vcc to GND.

When the signal line 54 is set to be active, the column pre-decoder 90 selectively makes one of four signal lines active in the signal-line set CA01, in accordance with the input column addresses (CA0–CA7). As described above, one of the four signal lines of each of the other three signal-line sets (CA23, CA45, and CA67) has already been selectively set to be active. The potentials of the signal lines which are selectively set to be active are the power supply potential (Vcc), as is apparent from FIG. 9.

At the same time when one signal line in the signal-line set CA01 is selectively set to be active, the column decoder 4 sets a column signal line 47 active, depending on the combination of the signal lines which are selectively set to be active by the column pre-decoder 90. The potential of the active column signal line 47 is the power supply potential (Vcc), the same as the potentials of the signal lines which are selectively set to be active in the signal-line sets (CA01, CA23, CA45, and CA67). As a result, the switching-element pair 34 which is connected to the column signal line 47 is turned ON, so that the bit-line pair 31 and the data-line pair 32 are electrically connected to each other.

When the signal line 55 is set to be active, the main amplifier 5 amplifies the potential difference which is transmitted to the data-line pair 32.

Generally, the capacitances of the data lines 32A and 32B are several times as large as the capacitances of the bit lines 31A and 31B. Accordingly, in the above conventional semiconductor memory device, when the bit-line pair 31 and the data-line pair 32 are connected via the switching-element pair 34 by the active column signal line 47, the potential difference of the bit-line pair 31 decreases, as is shown in FIG. 10.

There may occur a case where a column signal line 47 is set to be active by the column select signal before the potential difference of the bit-line pair 31 is sufficiently amplified, because the adjustment of the timing generating circuit 10 is insufficient, or because the power supply voltage fluctuates. Accordingly, as is shown in FIG. 11, the data of the bit-line pair 31 may possibly be inverted, when the bit-line pair 31 and the data-line pair 32 are electrically connected to each other. As a result, the data to be output to the data-line pair 32 is also inverted, which causes an error.

SUMMARY OF THE INVENTION

The semiconductor memory device of this invention includes: memory cells for storing data; bit-line pairs connected to the memory cells; bit-line precharge means for precharging the bit-line pairs to a prescribed potential; switching-element pairs for electrically connecting the bit-line pairs to data-line pairs; and column decoders each applying a column select signal to a corresponding one of the switching-element pairs in accordance with column addresses to be input, wherein a condition of $V_P \leq V_A \leq V_P + V_T$ is substantially satisfied, where $V_P$ represents the prescribed potential to which the bit-line pairs are precharged by the bit-line precharge means, $V_T$ represents a threshold voltage of each of the switching-element pairs, and $V_A$ represents a potential of the column select signal in an active state.

Thus, the invention described herein makes possible the advantage of providing a semiconductor memory device which can avoid any errors which may occur when the bit-line pair and the data-line pair are electrically connected.

This and other advantages of the present invention will become apparent to those skilled in the art upon reading and understanding the following detailed description with reference to the accompanying figures.

DESCRIPTION OF THE PREFERRED EMBODIMENTS

With respect to the conventional semiconductor memory device, we have found a reason why an error may occur when a column signal line 47 is set to be active by the column select signal and the bit-line pair 31 and the data-line pair 32 are electrically connected to each other. The reason will be described below.

Conventionally, the potential of the active column select signal is substantially the same as the power supply potential (Vcc), e.g., 5 volts (V). The potentials of the bit-line pair 31 and the data-line pair 32 are substantially the same as the half of the power supply potential ($\frac{1}{2}$ Vcc), e.g., 2.5 V. As is seen from the above, the potential of the active column select signal is higher than the potentials of the bit-line pair 31 and the data-line pair 32 by the threshold voltage of the switching-element pair 34 (generally, about 1 V) or more. As a result, whenever a column signal line 47 is set to be active by the column select line, the bit-line pair 31 and the data-line pair 32 are electrically connected to each other, irrespective of the condition whether the potential difference of the bit-line pair 31 is sufficiently amplified. This may cause an error.

Hereinafter, the present invention will be described by way of examples. According to the present invention, any error which may conventionally occur as mentioned above cannot be caused in principle.

EXAMPLE 1

Figure 1:
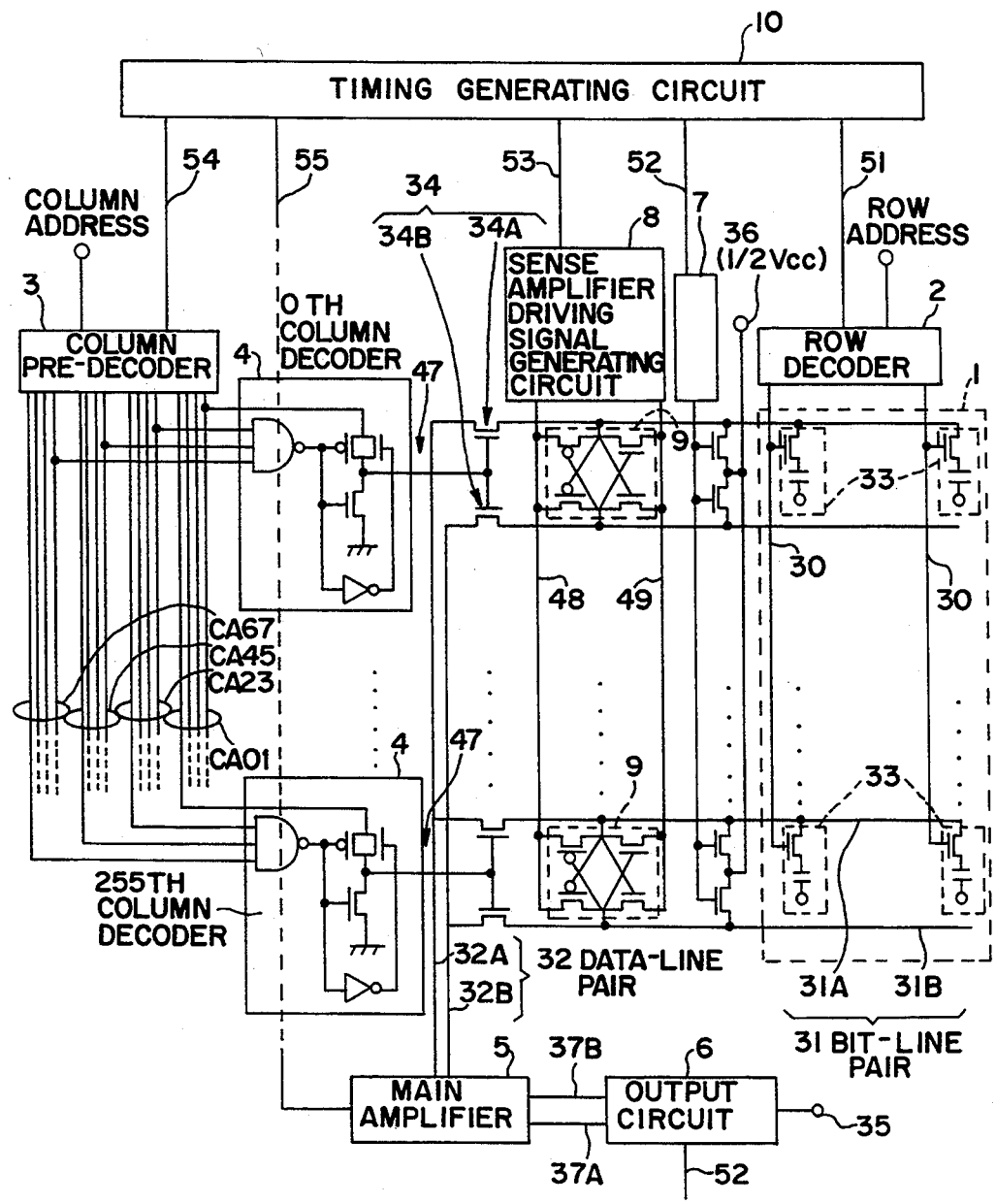
FIG. 1 is a diagram partially showing a circuit of a semiconductor memory device according to the invention.
Figure 8:
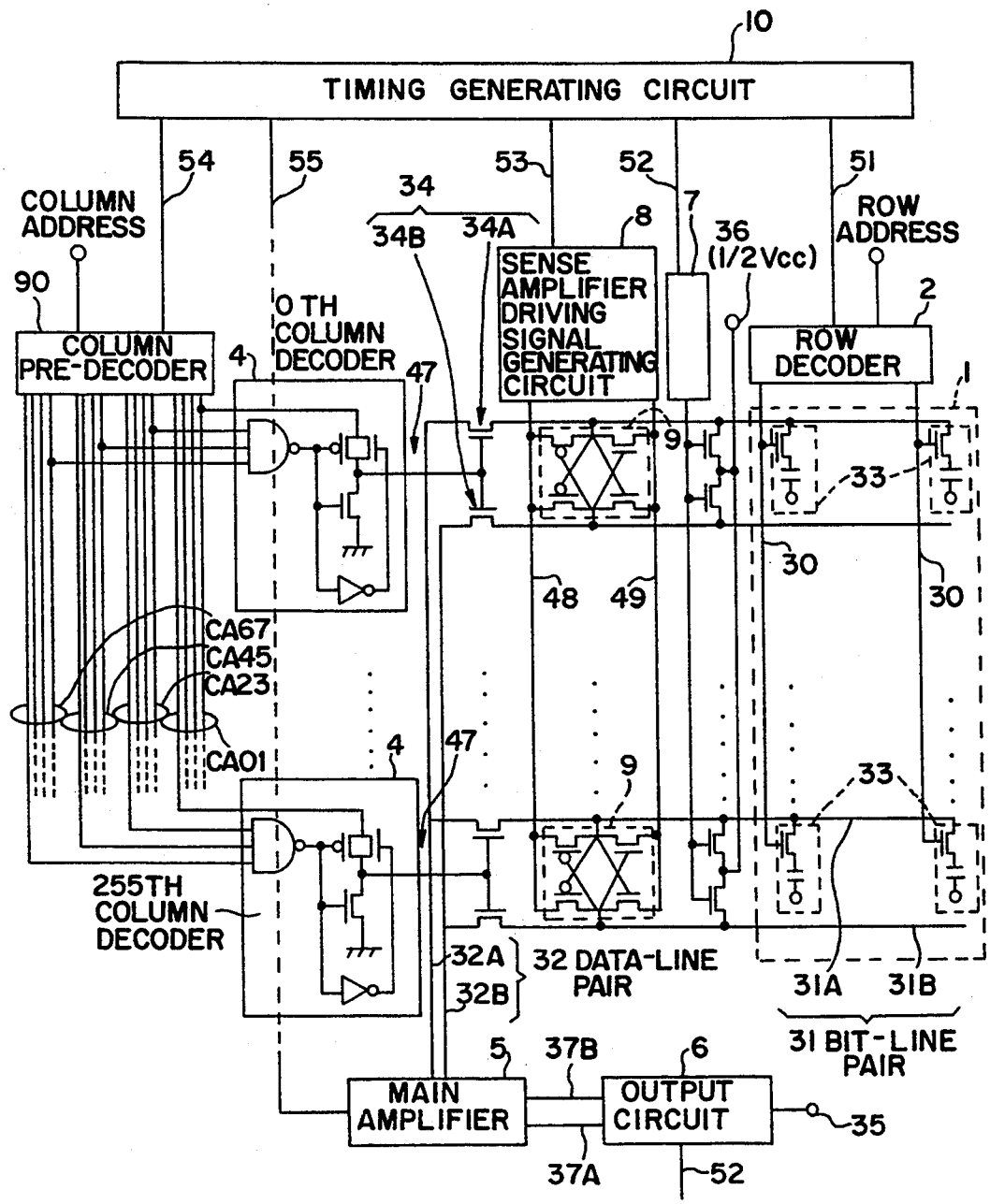
FIG. 8 is a diagram partially showing a circuit of a conventional semiconductor memory device.

FIG. 1 partially shows a circuit of a semiconductor memory device of a first example according to the invention. FIG. 1 is identical with FIG. 8 except for a column pre-decoder 3.

Figure 2:
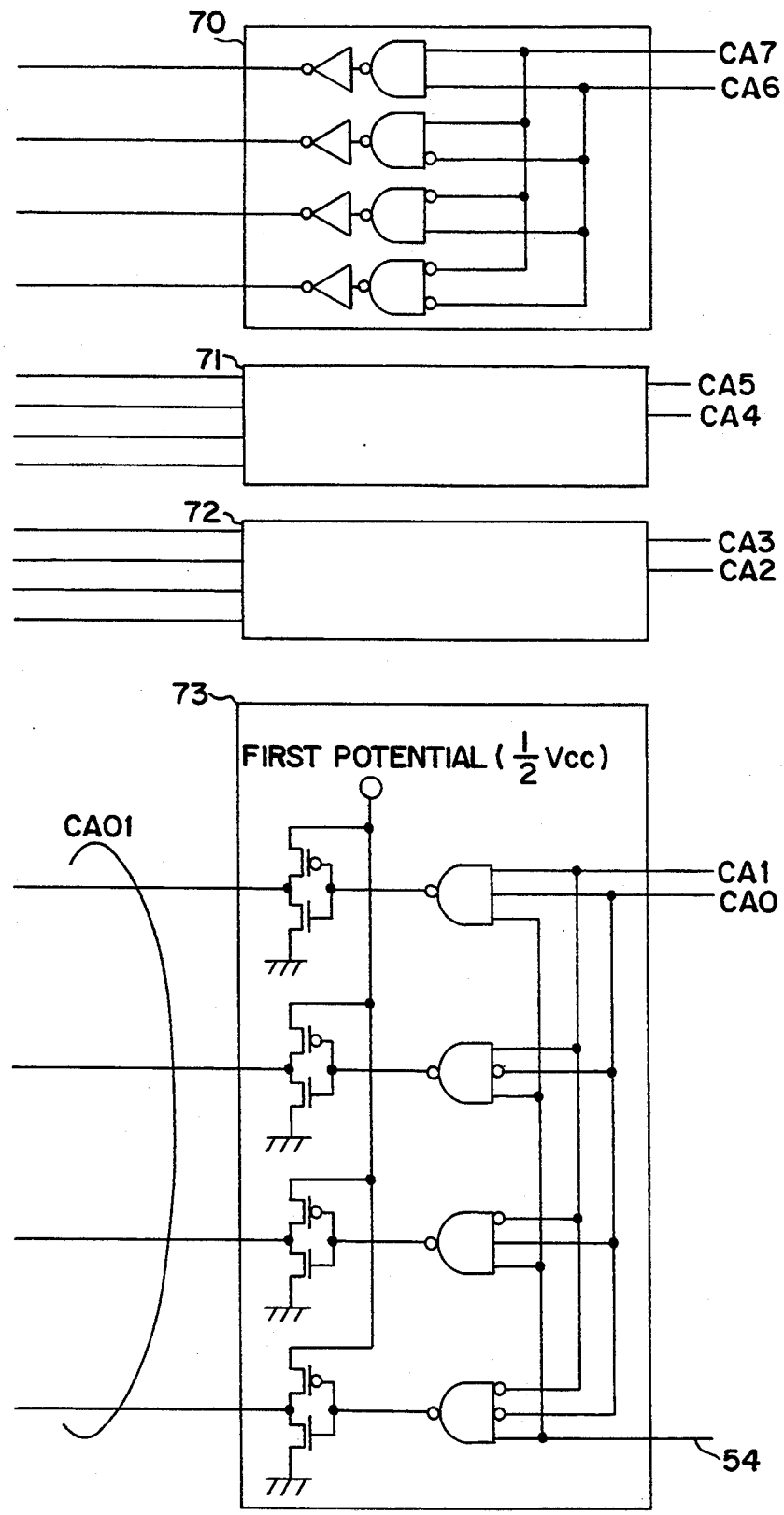
FIG. 2 is a diagram showing an exemplary configuration of a column pre-decoder in a semiconductor memory device of a first example.
Figure 9:
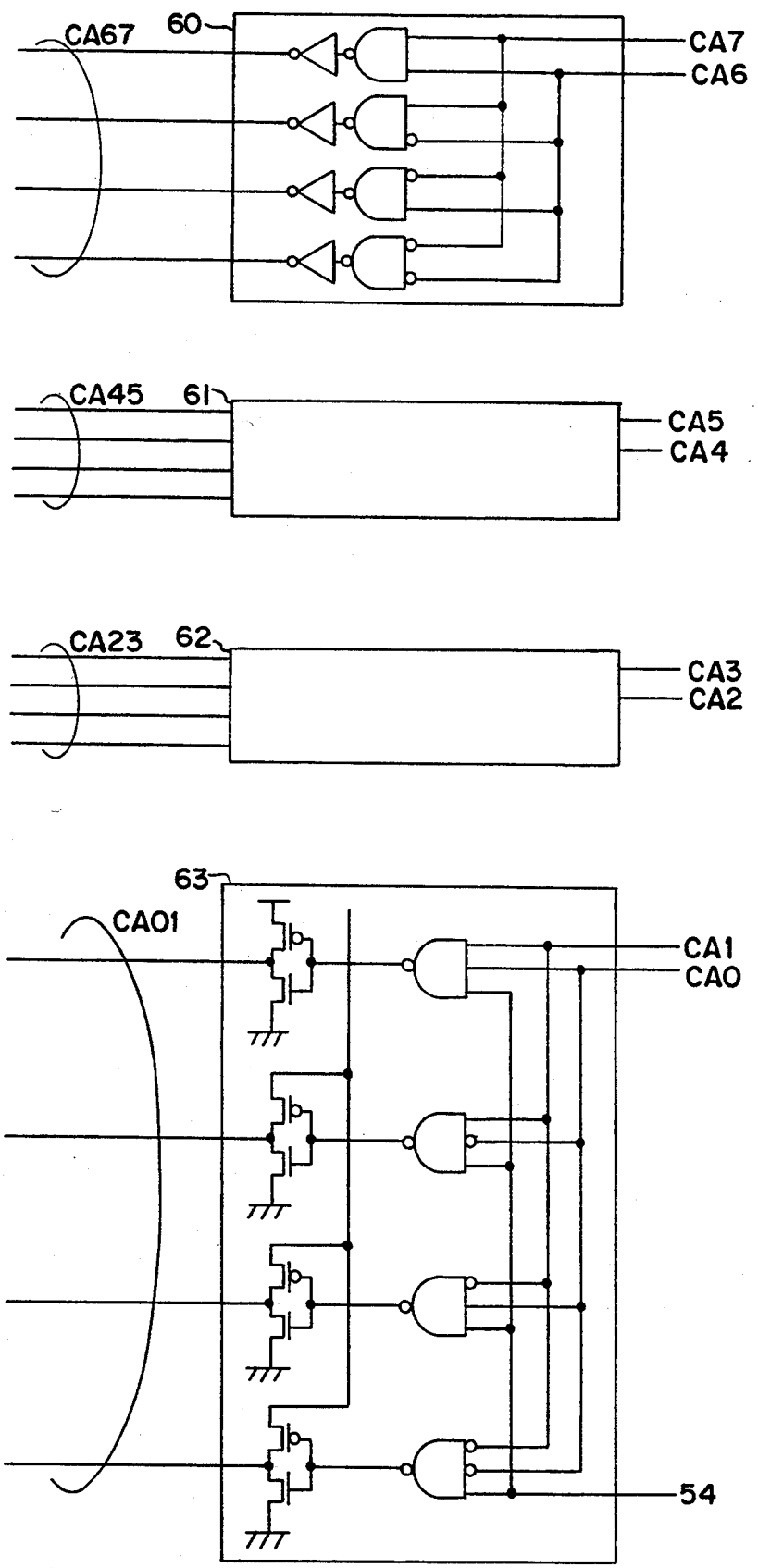
FIG. 9 is a diagram showing an exemplary configuration of the conventional semiconductor memory device.

FIG. 2 shows an exemplary configuration of the column pre-decoder 3 in the semiconductor memory device of the first example. The column pre-decoder 3 shown in FIG. 2 has the following difference from the column pre-decoder 90 shown in FIG. 9. In the conventional column pre-decoder 90 shown in FIG. 9, the power supply potential (Vcc) is used as a power supply for the inverter in the circuit 63 for selectively setting one signal line active in the signal-line set CA01. In the column pre-decoder 3 shown in FIG. 2, a potential which is substantially equal to the potential to which the bit-line pair 31 is precharged is used as a power supply for the inverter in a circuit 73. Accordingly, as is apparent from the circuit diagram of the column decoder 4 shown in FIG. 1, the potential of the active column select signal becomes substantially equal to the potential to which the bit-line pair 31 is precharged. The potential to which the bit-line pair 31 is precharged may be ½ Vcc, not being limited to any specific value. Herein, Vcc represents the power supply. potential. Hereinafter, the potential to which the bit-line pair 31 is precharged is assumed to be ½ Vcc.

Figure 3:
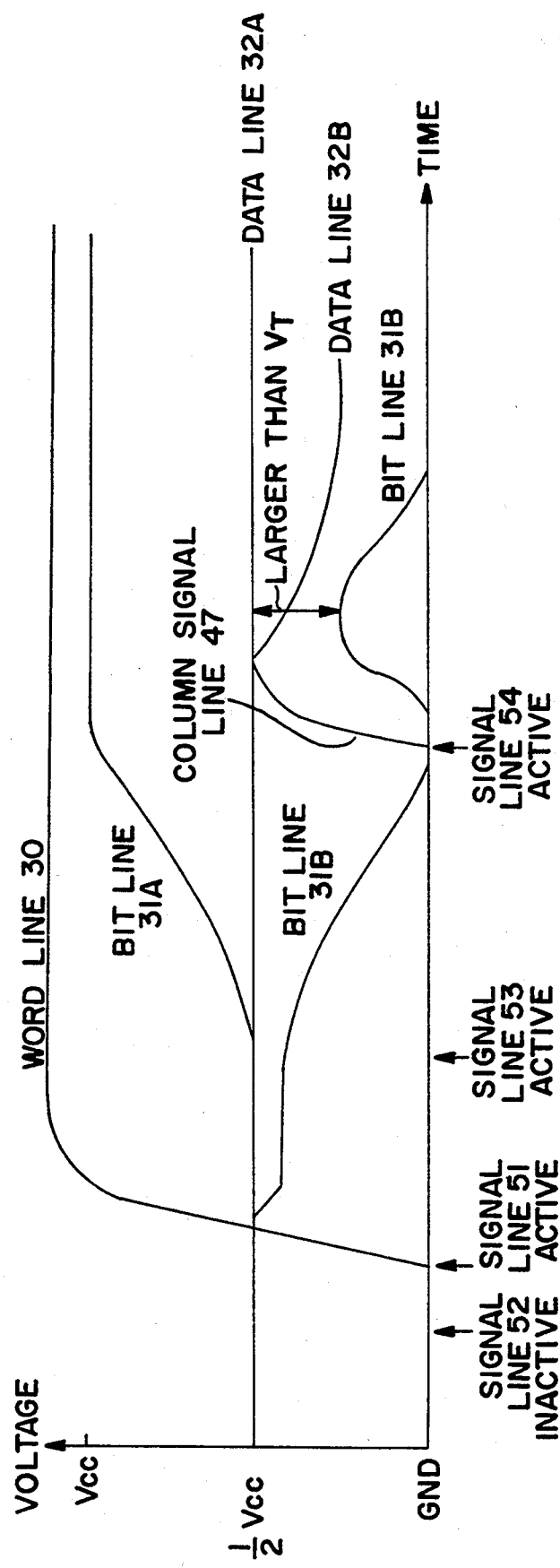
FIG. 3 is a diagram showing exemplary potential variations of various signal lines during the operation of the semiconductor memory device of the first example.
Figure 10:
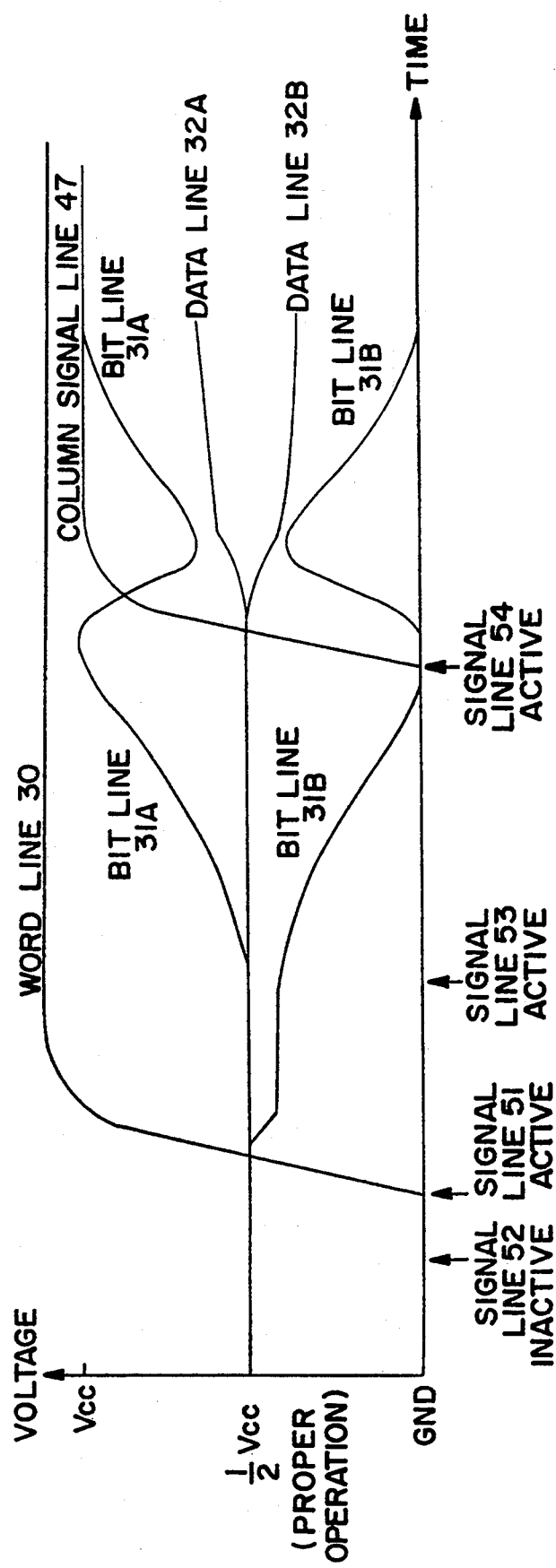
FIG. 10 is a diagram showing exemplary potential variations of various signal lines during the operation of the conventional semiconductor memory device.
Figure 11:
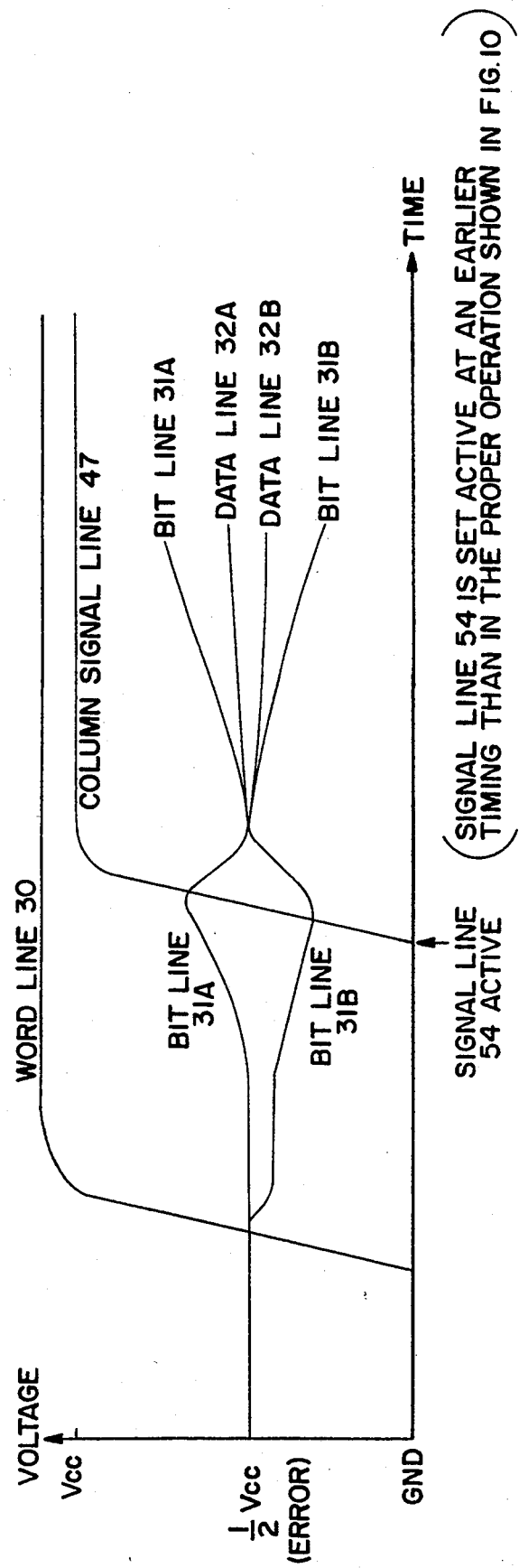
FIG. 11 is a diagram showing exemplary potential variations of various signal lines during the operation of the conventional semiconductor memory device.

FIG. 3 shows potential variations of various signal lines during the operation of the semiconductor memory device of the first example. Only the differences from FIG. 10 will be described. The potential of the active column select signal is approximately ½ Vcc, as described above. As a result, when a column signal line 47 is set active by the column select signal, the switching element 34A which is connected to the bit line 31A is not turned ON. Thus, the potential of the bit line 31A (H data) does not lower. The switching element 34B which is connected to the bit line 31B is turned ON. However, the potential of the bit line 31B (L data) only rises to ½ Vcc–$V_T$ at the worst, where $V_T$ represents a threshold voltage of each of the switching elements 34A and 34B. Because, if the potential of the bit line 31B (L data) rises to ½ Vcc–$V_T$ or a higher level, the switching element 34B is turned OFF.

Figure 4:
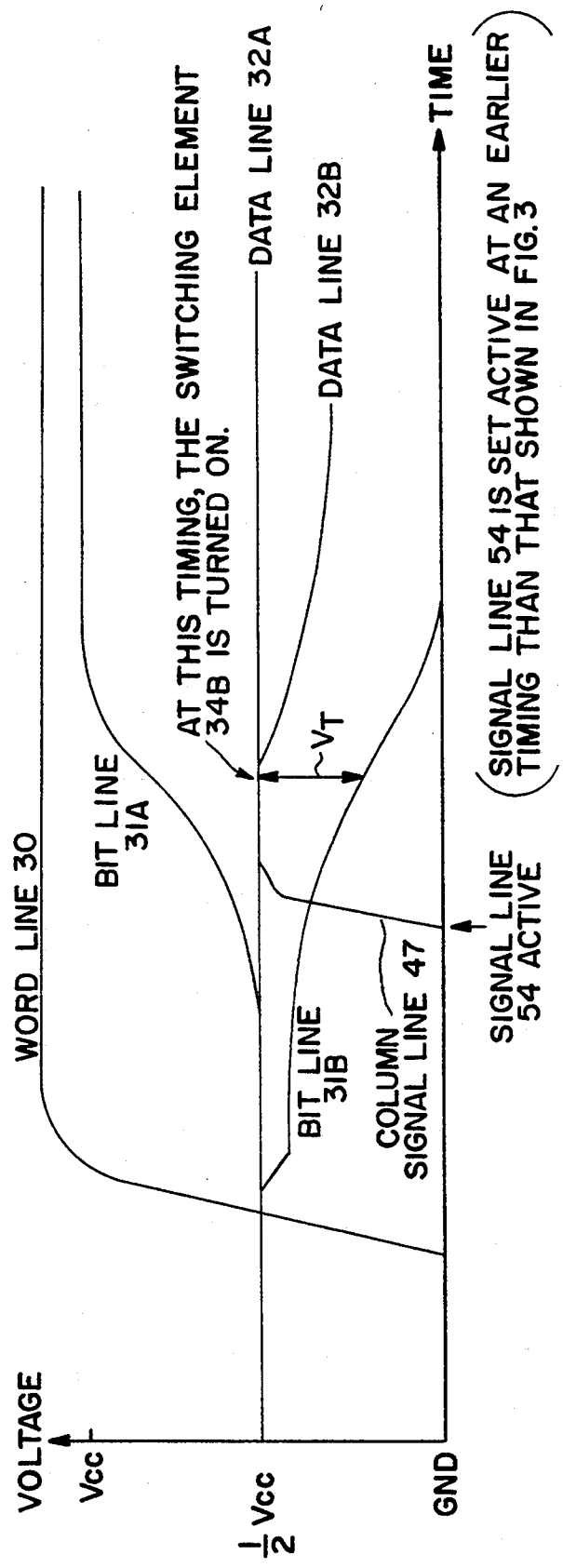
FIG. 4 is a diagram showing exemplary potential variations of various signal lines during the operation of the semiconductor memory device of the first example.

FIG. 4 shows potential variations of various signal lines in the semiconductor memory device of the first example, in the case where the timing at which the signal line 54 is set to be active occurs earlier than the timing shown in FIG. 3. In FIG. 4, a column signal line 47 is set to be active before the potential difference of the bit-line pair 31 is not sufficiently amplified. Accordingly, at the time when the column signal line 47 is set to be active, neither the switching elements 34A nor 34B are turned ON. Until the potential of the bit line 31B lowers below ½ Vcc–$V_T$ by sufficiently amplifying the potential difference of the bit-line pair 31, the switching element 34B is not turned ON. Therefore, even if the timing at which the signal line 54 is set to be active occurs earlier, a data inversion, i.e., an error cannot be caused.

In a semiconductor memory device of the first example according to the invention, the potential of the active column select signal is set so as to be substantially equal to the potential to which the bit-line pair is precharged. Accordingly, even in such a case as caused by the timing shift or the like, where a column signal line 47 is set to be active by the column select signal before the potential difference of the bit-line pair 31 is sufficiently amplified, especially when the respective potentials of the bit lines 31A and 31B are approximately ½ Vcc, the switching-element pair 34 is not turned ON. In another case where the potential difference of the bit-line pair 31 is sufficiently large and the potential of one of the bit lines 31A and 31B comes closer to the GND potential, when a column signal line 47 is set to be active by the column select signal, the switching-element pair 34 is immediately turned ON. However, the switching-element pair 34 is controlled so as to be turned OFF when the potential difference of the bit-line pair 31 becomes smaller. Therefore, according to the semiconductor memory device of the invention, any error which may conventionally occur when the bit-line pair 31 and the data-line pair 32 are electrically connected cannot be caused in principle.

EXAMPLE 2

Figure 5:
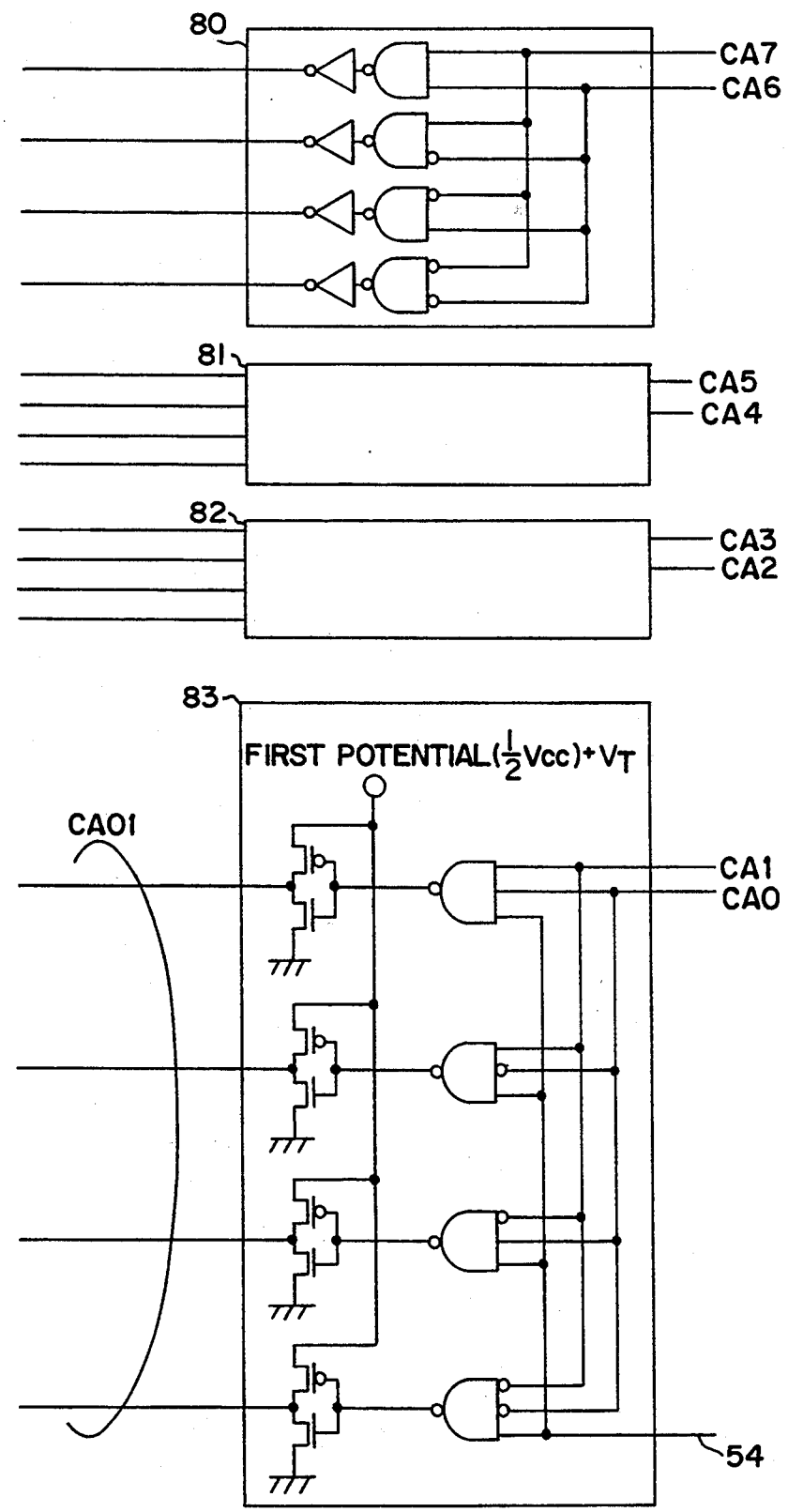
FIG. 5 is a diagram showing an exemplary configuration of a column pre-decoder in a semiconductor memory device of a second example.

FIG. 5 shows another exemplary configuration of the column pre-decoder 3 in a semiconductor memory device of a second example. The semiconductor memory device of the second example is different from the semiconductor memory device of the first example in that the potential which is substantially equal to the potential obtained by adding the threshold voltage of the switching-element pair 34 to the potential to which the bit-line pair 31 is precharged, is used as a power supply for the inverter in a circuit 83 for selectively setting one signal line active in the signal-line set CA01. As a result, the potential of the active column select signal becomes substantially equal to the potential obtained by adding the threshold voltage of the switching-element pair 34 to the potential to which the bit-line pair 31 is precharged. The potential to which the bit-line pair 31 is precharged may be ½ Vcc, not being limited to the specific value, where Vcc represents the power supply potential. Hereinafter, the potential to which the bit-line pair 31 is precharged is assumed to be ½ Vcc.

Figure 6:
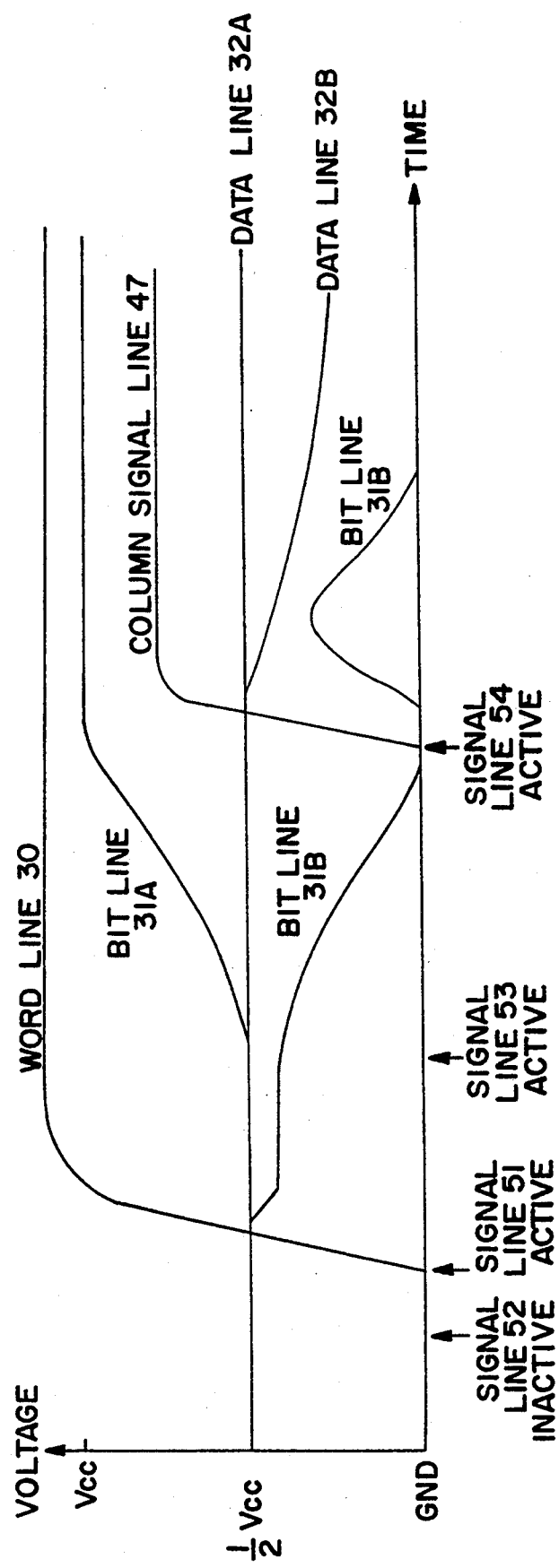
FIG. 6 is a diagram showing exemplary potential variations of various signal lines during the operation of the semiconductor memory device of the second example.

FIG. 6 shows potential variations of various signal lines during the operation of the semiconductor memory device of the second example. When a column signal line 47 is set to be active by the column select signal, the switching element 34B is turned ON. Thus, the potential of the bit line 31B (L data) rises but does not exceed ½ Vcc. Because, when the potential of the bit line 31B exceeds ½ Vcc, the switching element 34B is turned OFF. In addition, the switching element 34A which is connected to the bit line 31A (H data) is not be turned ON.

Figure 7:
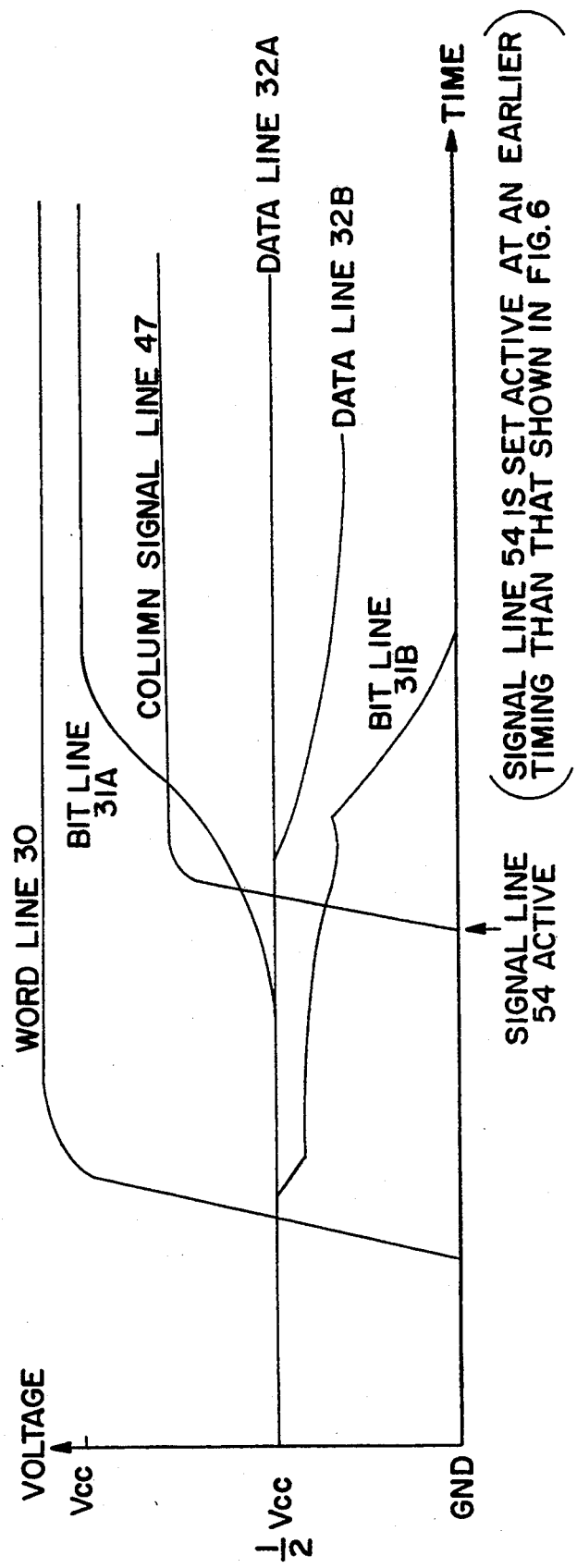
FIG. 7 is a diagram showing exemplary potential variations of various signal lines during the semiconductor memory device of the second example.

FIG. 7 shows potential variations of various signal lines in the semiconductor memory device of the second example in the case where the timing at which the signal line 54 is set to be active occurs earlier than the timing shown in FIG. 6. In FIG. 7, a column signal line 47 is set to be active before the potential difference of the bit-line pair 31 is not sufficiently amplified. When the column signal line 47 is set to be active, the switching element 34B is turned ON, but the potential of the bit line 31B (L data) does not exceed ½ Vcc. In addition, the switching element 34A which is connected to the bit line 31A (H data) is not turned ON. Therefore, even if the timing at which the signal line 54 is set to be active occurs earlier, data inversion, i.e., an error cannot be caused.

As described above, in the first example, the potential of the active column select signal is set so as to be substantially equal to the potential ($V_P$) to which the bit-line pair 31 is precharged. In the second example, the potential of the active column select signal is set so as to be substantially equal to the potential obtained by adding the threshold voltage ($V_T$) of the switching-element pair 34 to the potential ($V_P$) to which the bit-line pair 31 is precharged.

According to a semiconductor memory device of the second example of the present invention, any error which may conventionally occur when the bit-line pair 31 and the data-line pair 32 are electrically connected cannot be caused in principle for at least the same reason as the first example of the present invention.

In an alternative example, the potential ($V_A$) of the active column select signal may be set so as to substantially satisfy the condition of $V_P \leq V_A \leq V_P + V_T$, where $V_P$ represents the potential to which the bit-line pair 31 is precharged, $V_T$ represents the threshold voltage of the switching-element pair 34. In the alternative case where the potential ($V_A$) of the active column select signal is set so as to substantially satisfy the above condition, the same effects which are attained by the first and the second examples can be attained.

According to the invention, when the bit-line pair 31 and the data-line pair 32 are electrically connected to each other, errors such as data destruction cannot be caused, even in the case where the timing at which a column signal line 47 is set to be active is shifted from the timing at which the potential difference of the bit-line pair 31 is sufficiently amplified, due to such causes as that the timing generating circuit 10 is insufficiently adjusted, that the power supply voltage fluctuates, and that the amplification of the potential difference of the bit-line pair 31 by the sense amplifier 9 is delayed. Therefore, according to the invention, a semiconductor memory device which can avoid any error when the bit-line pair 31 and the data-line pair 32 are electrically connected to each other can be provided.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:
   memory cells for storing data;
   bit-line pairs connected to said memory cells;
   bit-line precharge means for precharging said bit-line pairs to a prescribed potential;
   switching-element pairs for electrically connecting said bit-line pairs to data-line pairs; and
   column decoders each applying a column select signal to a corresponding one of said switching-element pairs in accordance with column addresses to be input,
   wherein a condition of $V_A \leq V_P + V_T$ is substantially satisfied, where $V_P$ represents said prescribed potential to which said bit-line pairs are precharged by said bit-line precharge means, $V_T$ represents a threshold voltage of each of said switching-element pairs, and $V_A$ represents a potential of said column select signal in an active state.

2. A semiconductor memory device according to claim 1, wherein a condition of $V_P \leq V_A$ is substantially satisfied, where $V_P$ represents said prescribed potential to which said bit-line pairs are precharged by said bit-line precharge means, and $V_A$ represents said potential of said column select signal in an active state.

3. A semiconductor memory device according to claim 1, wherein said prescribed potential to which said bit-line pairs are precharged by said bit-line precharge means is substantially equal to the half of a power supply potential.

4. A semiconductor memory device comprising:
   memory cells for storing data;
   bit-line pairs connected to said memory cells;
   bit-line precharge means for precharging said bit-line pairs to a prescribed potential;
   switching-element pairs for electrically connecting said bit-line pairs to data-line pairs; and
   column decoders each applying a column select signal to a corresponding one of said switching-element pairs in accordance with column addresses to be input,
   wherein a condition of $V_A \leq V_P + V_T$ is substantially satisfied, where $V_P$ represents said prescribed potential to which said bit-line pairs are precharged by said bit-line precharge means, $V_T$ represents a threshold voltage of each of said switching-element pairs, and $V_A$ represents a potential of said column select signal in an active state, and
   wherein each of said switching-element pairs electrically connects one of said bit-line pairs to a corresponding one of said data-line pairs when a potential difference between one bit line and the other bit line of said one of said bit-line pairs is higher than a predetermined potential, and
   each of said switching-element pairs electrically disconnects one of said bit-line pairs from a corresponding one of said data-line pairs when a potential difference between one bit line and the other bit line of said one of said bit-line .pairs is lower than said predetermined potential.

5. A semiconductor memory device according to claim 4, wherein a condition of $V_P \leq V_A$ is substantially satisfied, where $V_P$ represents said prescribed potential to which said bit-line pairs are precharged by said bit-line precharge means, and $V_A$ represents said potential of said column select signal in an active state.

6. A semiconductor memory device according to claim 4, wherein said prescribed potential to which said bit-line pairs are precharged by said bit-line precharge means is substantially equal to half of a power supply potential.

* * * * *